United States Patent
Tsirkin

(10) Patent No.: US 10,152,275 B1
(45) Date of Patent: Dec. 11, 2018

(54) REVERSE ORDER SUBMISSION FOR POINTER RINGS

(71) Applicant: Red Hat, Inc., Raleigh, NC (US)

(72) Inventor: Michael Tsirkin, Lexington, MA (US)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 15/690,757

(22) Filed: Aug. 30, 2017

(51) Int. Cl.
G06F 12/00 (2006.01)
G06F 3/06 (2006.01)
G06F 9/455 (2018.01)
G11C 21/00 (2006.01)

(52) U.S. Cl.
CPC ............ *G06F 3/0656* (2013.01); *G06F 3/065* (2013.01); *G06F 3/067* (2013.01); *G06F 3/0619* (2013.01); *G06F 9/45558* (2013.01); *G11C 21/00* (2013.01); *G06F 2009/45583* (2013.01)

(58) Field of Classification Search
CPC ...... G06F 3/0656; G06F 3/0619; G06F 3/065; G06F 3/067; G06F 9/45558; G06F 2009/45583; G11C 21/00
See application file for complete search history.

(56) References Cited

U.S. PATENT DOCUMENTS

| | | | |
|---|---|---|---|
| 5,826,041 A | 10/1998 | Ogus | |
| 6,483,804 B1 | 11/2002 | Muller et al. | |
| 7,042,948 B2 | 5/2006 | Kim et al. | |
| 7,113,985 B2 | 9/2006 | Narad et al. | |
| 8,103,785 B2 | 1/2012 | Crowley et al. | |
| 8,760,460 B1 | 6/2014 | Kilgariff et al. | |
| 8,874,802 B2 | 10/2014 | Thakkar | |
| 2006/0236011 A1 | 10/2006 | Narad et al. | |
| 2017/0162236 A1* | 6/2017 | Morimoto | G11C 7/1045 |

OTHER PUBLICATIONS

Simon Cooke; The Bip Buffer—The Circular Buffer with a Twist; Sep. 19, 2014; Code Project, pp. 1-7.
Patrick P. C. Lee, Tian Bu, Girish Chandranmenon; A Lock-Free, Cache-Efficient Shared Ring Buffer for Multi-Core Architectures; Department of Computer Science and Engineering, The Chinese University of Hong Kong. Alcatel/Lucent, Bell Laboratories, USA; ANCS '09, Oct. 19-20, 2009, Princeton, New Jersey, pp. 1-2.

* cited by examiner

*Primary Examiner* — Matthew Bradley
(74) *Attorney, Agent, or Firm* — K&L Gates LLP

(57) ABSTRACT

A reverse order submission system includes a first memory including a ring buffer, a second memory, and a processor in communication with the first memory. The processor includes a consumer processor and a producer processor, and the producer processor is configured to receive a batch of memory entries. Further, the producer processor is configured to identify a last memory entry in the batch that can be stored in an invalid value slot in the ring buffer, walk the ring buffer backwards, and store each respective memory entry in each respective slot from an end slot to the original slot in the ring buffer. The end slot is a slot associated with the final memory entry ending the batch of memory entries or a slot preceding a valid value slot.

20 Claims, 8 Drawing Sheets

REVERSE ORDER SUBMISSION FOR POINTER RINGS

BACKGROUND

Computer systems may routinely copy memory entries from one memory to a different memory. For example, while forwarding incoming networking traffic to a physical or virtual machine, packets may be received and later copied to another memory location. Processors may execute instructions to read, write, and copy memory entries, such as packet addresses to forward networking traffic to different machines. For example, memory entries may be temporarily stored in ring buffers on a first-in-first-out basis before being copied to the memory associated with a different machine. Specifically, incoming networking traffic may be stored on a ring buffer and later copied to virtual machine memory.

SUMMARY

The present disclosure provides new and innovative systems and methods for reverse order submission for pointer rings. In an example, a system includes a first memory including a ring buffer having a plurality of slots, a second memory, and at least one processor in communication with the first memory. The at least one processor includes a consumer processor and a producer processor, and the producer processor is configured to receive a batch of memory entries having an initial memory entry and a final memory entry ending the batch of memory entries. Additionally, the producer processor is configured to walk the ring buffer starting from an original slot, which is indicated by a current producer pointer. Further, the producer processor is configured to identify a last memory entry in the batch of memory entries that can be stored in an invalid value slot (e.g., empty slot) in the ring buffer, walk the ring buffer backwards from an end slot associated with the last memory entry to the original slot, and store each respective memory entry from the last memory entry to the initial memory entry in each respective slot from the end slot to the original slot in the ring buffer. The end slot is a slot associated with the final memory entry ending the batch of memory entries or a slot preceding a valid value slot.

In an example, a method includes receiving, by a producer processor, a batch of memory entries having an initial memory entry and a final memory entry ending the batch of memory entries. Then, the producer processor walks a ring buffer starting from an original slot, which is indicated by a current producer pointer. The producer processor also identifies a last memory entry in the batch of memory entries that can be stored in an invalid value slot (e.g., empty slot) the ring buffer, walks the ring buffer backwards from an end slot associated with the last memory entry to the original slot, and stores each respective memory entry from the last memory entry to the initial memory entry in each respective slot from the end slot to the original slot in the ring buffer. The end slot is a slot associated with the final memory entry ending the batch of memory entries or a slot preceding a valid value slot.

In an example, a non-transitory machine readable medium stores code, which when executed by a producer processor, is configured to receive a batch of memory entries having an initial memory entry and a final memory entry ending the batch of memory entries, and walk a ring buffer starting from an original slot, which is indicated by a current producer pointer. Further, the non-transitory machine readable medium is configured to identify a last memory entry in the batch of memory entries that can be stored in an invalid value slot (e.g., empty slot) in the ring buffer, walk the ring buffer backwards from an end slot associated with the last memory entry to the original slot, and store each respective memory entry from the last memory entry to the initial memory entry in each respective slot from the end slot to the original slot in the ring buffer. The end slot is a slot associated with the final memory entry ending the batch of memory entries or a slot preceding a valid value slot.

Additional features and advantages of the disclosed method and apparatus are described in, and will be apparent from, the following Detailed Description and the Figures. The features and advantages described herein are not all-inclusive and, in particular, many additional features and advantages will be apparent to one of ordinary skill in the art in view of the figures and description. Moreover, it should be noted that the language used in the specification has been principally selected for readability and instructional purposes, and not to limit the scope of the inventive subject matter.

DETAILED DESCRIPTION OF EXAMPLE EMBODIMENTS

Figure 1:
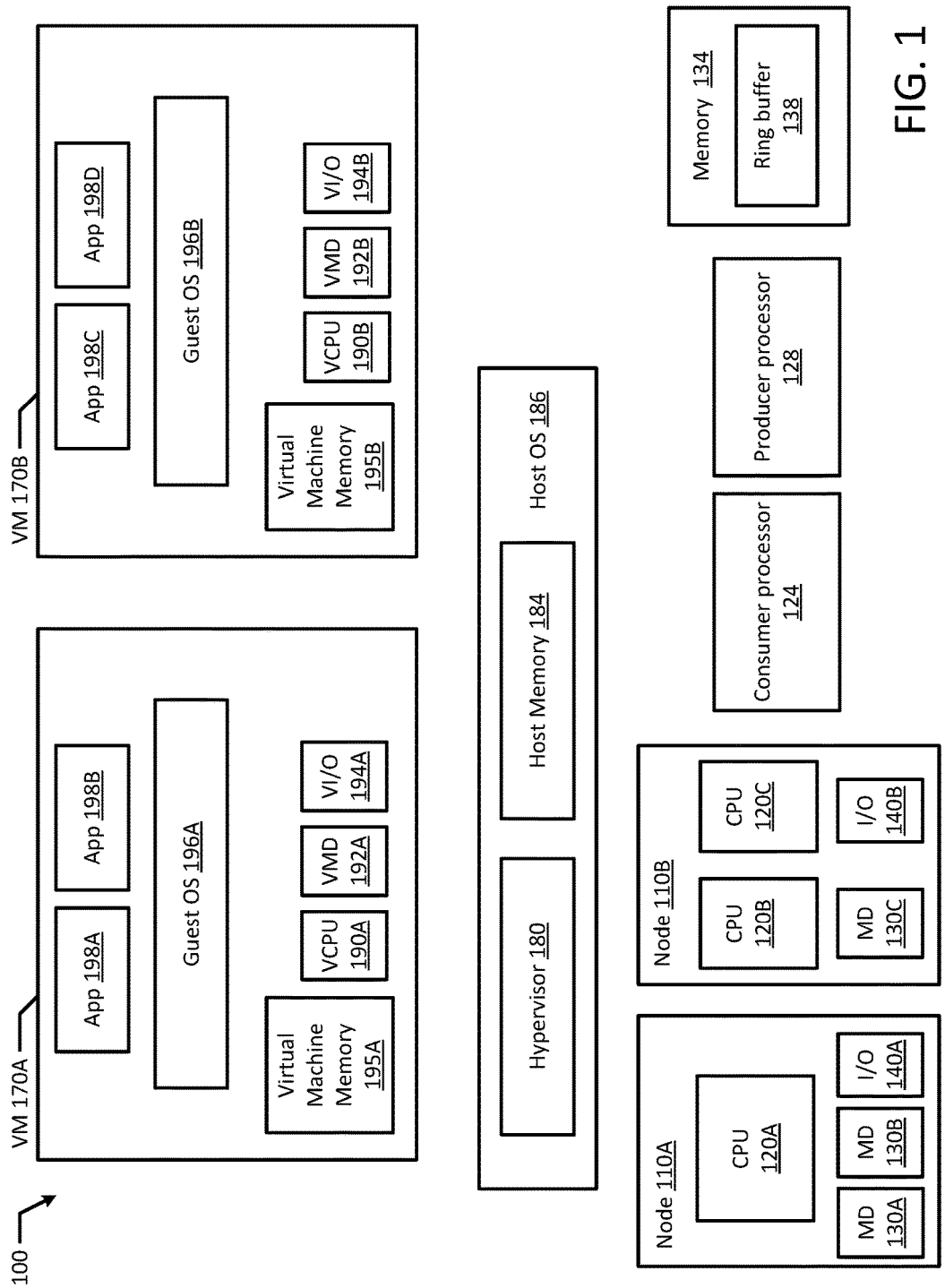
FIG. 1 illustrates a block diagram of an example computing system according to an example embodiment of the present disclosure.

Techniques are disclosed for reverse order submission for pointer rings when receiving data and copying data from one memory location (e.g., ring buffer) to a different memory. For example, the techniques disclosed may be used when receiving network traffic and forwarding incoming network traffic to a virtual machine by a hypervisor, which may include receiving a packet from a network interface controller (NIC) in hypervisor memory and copying the packet to virtual machine memory. The act of receiving the data (e.g., packets) and copying the data may be executed on the same processor (e.g., CPU), however, parallelizing the actions on separate processors or separate processor cores may provide significant performance advantages. Currently, techniques of parallelizing the receiving and copying may involve a first CPU receiving an interrupt from a NIC, receiving packets from the NIC, and adding the packets to a list in a shared memory. A second CPU runs a thread to retrieve the packets from the list and copy the packets to VM memory. Because the parallel process utilizes two CPUs, the process adds additional overhead because adding and removing packets on one list requires cross-CPU communication through shared memory. Traditionally, a linked list or a producer/consumer ring was used without much added performance as false cache sharing typically outweighed the benefits of parallelism.

Additionally, other approaches such as a typical circular buffer design often creates cache line bounces between the two CPUs. For example, a ring data structure (e.g., an array with a plurality of slots) may be used with a producer processor and a consumer processor (or producer CPU and consumer CPU). In the disclosed implementation, an interrupt handling processor or producer processor may maintain a producer pointer. The producer pointer may store data, such as the address of each packet received at the slot addressed by the producer pointer. The producer processor may increment the pointer to address the next slot, thereby wrapping around at the end of the array. To avoid overruns, before storing the data (e.g., the address of each packet and/or packet), the producer processor may test the value in each slot. If the value valid (e.g., not NULL or non-NULL), the data is not stored in the list and may be discarded. A data copying processor or consumer processor may maintain a consumer pointer. The consumer processor may test the value pointed to by the consumer pointer. If the value is invalid (e.g., NULL), then the array is empty and the consumer processor may stop and wait for more packets. If the value is valid (e.g., not NULL or non-NULL), the consumer processor may retrieve the data, such as a packet address. Then, the consumer processor may invalidate the slot (e.g., write NULL into the slot) and may advance the consumer pointer to the next slot. The retrieved data may be copied to a second memory location (e.g., virtual machine memory).

Invalidating a slot (e.g., storing a NULL value in a slot) advantageously allows reuse of the slot for additional data (e.g., forwarding a new packet). However, this data structure may experience performance bottlenecks. For example, when a driver is not highly optimized, copying or recording may be faster than receiving packets. As a result, the ring may be empty or close to empty for a large part of the time, and as each packet slot is produced or made available in the ring buffer by the producer processor, the packet slot may be immediately copied and made invalid again by the copying handling processor or consumer processor, which may cause a cache line to bounce between the processors and results in a significant slowdown. Due to the bottleneck and resulting slowdown from cache line bounces, the producer processor may be unable to get ahead of the consumer processor resulting in cache line bounces for each data operation in the ring buffer.

A proposed solution to the cache line bounces described above was to load a network interface controller (NIC) driver in a virtual machine as a pass-through to avoid the need for packet forwarding. However, this approach breaks migration and overcommit, which may cause the host or computer system to crash. Additionally, even though producing or consuming multiple memory entries or packets at once may cause a single invalidation, such batching may require waiting for multiple packets to become available through receive coalescing or rx coalescing, which may increase latency and add overhead for running timers on the host. For example, rx coalescing may wait a predetermined amount of time before raising an rx interrupt after a memory entry or packet has been received. Similarly, rx coalescing may involve waiting for a specified number of memory entries or packets to queue up before raising an rx interrupt.

Further, the proposed solution of loading a NIC driver in a virtual machine as a pass-through (e.g., with rx coalescing) may cause delays while waiting for additional packets and may result in additional overhead as a result of using a complex consumer or producer processor.

Another proposed solution to the cache line bounces described above was to reserve extra slots in the ring, which would remain unused to space out the producer thread and consumer thread such that they were not accessing the same cache line. However, ring size is often designed in powers of two to allow optimization. If a ring with 128 active slots is needed, then by adding unused slots, the implemented ring would be designed with 256 slots (e.g., next power of two above 128 slots). For example, if 128 active slots will be utilized, and 10 slots will remain unused, then the ring needs a minimum of 138 slots. Due to the common practice of increasing ring buffer size by a factor of two, the next logical ring buffer size is 256 slots (e.g., next largest size up from 128 slots). However, larger rings are problematic because the processors keep watch over the ring, and a larger ring puts more pressure on cache. Moreover, only actively using, for example, 128 slots of 256 slots is not an efficient use of hardware resources.

As described in the various example embodiments disclosed herein, to reduce the frequency of cache line bounces and prevent slowdown, the producer processor receives a batch of packets and starts walking the ring buffer from a slot, such as the slot indicated by a current producer pointer. As the producer processor walks the ring, the producer processor may test the contents of each slot in the ring. The walk ends when a valid (e.g., busy, not consumed slot) slot is identified or after walking an adequate number of slots in order to store the entire batch of packets. After identifying the last memory entry (e.g., packet) in the batch that can be stored in the ring, the producer processor walks the ring buffer and batch of packets backwards and at each successive slot a packet in the batch is stored in the ring. In an example, the batch of packets is walked such that the order of packets in the ring is the same as the order of packets in the batch. Due to producing memory entries (e.g., packets) in groups or batches, the consumer processor is held back and starts consuming entries in the ring after the producer processor has made progress. Thus, the producer processor may advantageously produce or store a batch of packets elsewhere in the ring (e.g., a few slots ahead of the consumer processor) such that multiple packets are produced in the ring before the cache line bounces between the producer processor and consumer processor, even when the ring is empty or almost empty. Thus, cache line bounces are advantageously reduced and performance is improved. For example, the above producer processor modification may improve packet throughput by approximately ten percent or more.

Instead of the cache line constantly bouncing between the producer processor and consumer processor, the producer processor produces a batch of memory entries at a time, which advantageously allows the producer processor to produce or store multiple memory entries before the cache line bounces to the consumer processor, thereby improving performance and throughput without doubling the ring size as described above.

FIG. 1 depicts a high-level component diagram of an example computing system 100 in accordance with one or more aspects of the present disclosure. The computing system 100 may include an operating system (e.g., host OS 186), one or more virtual machines (VM 170A-B), nodes (e.g., nodes 110A-B), a consumer processor 124, a producer processor 128, and memory 134 including a ring buffer 138. Ring buffer 138 may be a data structure using a single, fixed-size buffer as if it were connected end-to-end (e.g., in a ring). In an example, the ring buffer 138 may be a first-in-first-out (FIFO) data structure. For example, memory entries such as packet addresses may be written into and retrieved from the ring buffer 138. Additionally, the ring buffer 138 may have a plurality of slots, which may store memory entries. The slots may be tracked by pointers or indices, such as a head pointer and a tail pointer. In an example, the consumer processor 124 may maintain the head pointer and the tail pointer.

Virtual machines 170A-B may include a guest OS, guest memory, a virtual CPU (VCPU), virtual memory devices (VMD), and virtual input/output devices (VI/O). For example, virtual machine 170A may include guest OS 196A, guest memory or virtual machine memory 195A, a virtual CPU 190A, a virtual memory devices 192A, and virtual input/output device 194A. Virtual machine memory 195A may include one or more memory pages. Similarly, virtual machine 170B may include guest OS 196B, virtual machine memory 195B, a virtual CPU 190B, a virtual memory devices 192B, and virtual input/output device 194B. Virtual machine memory 195B may include one or more memory pages.

The computing system 100 may also include a hypervisor 180 and host memory 194. Hypervisor 180 may manage host memory 184 for the host operating system 186 as well as memory allocated to the virtual machines 170A-B and guest operating systems 196A-B such as guest memory or virtual machine memory 195A-B provided to guest OS 196A-B. Host memory 184 and virtual machine memory 195A-B may be divided into a plurality of memory pages that are managed by the hypervisor 180. Virtual machine memory 195A-B allocated to the guest OS 196A-B may be mapped from host memory 184 such that when a guest application 198A-D uses or accesses a memory page of virtual machine memory 195A-B, the guest application 198A-D is actually using or accessing host memory 184.

In an example, a virtual machine 170A may execute a guest operating system 196A and run applications 198A-B which may utilize the underlying VCPU 190A, VMD 192A, and VI/O device 194A. One or more applications 198A-B may be running on a virtual machine 170A under the respective guest operating system 196A. A virtual machine (e.g., VM 170A-B, as illustrated in FIG. 1) may run on any type of dependent, independent, compatible, and/or incompatible applications on the underlying hardware and OS. In an example, applications (e.g., App 198A-B) run on a virtual machine 170A may be dependent on the underlying hardware and/or OS 186. In another example embodiment, applications 198A-B run on a virtual machine 170A may be independent of the underlying hardware and/or OS 186. For example, applications 198A-B run on a first virtual machine 170A may be dependent on the underlying hardware and/or OS 186 while applications (e.g., application 198C-D) run on a second virtual machine (e.g., VM 170B) are independent of the underlying hardware and/or OS 186A. Additionally, applications 198A-B run on a virtual machine 170A may be compatible with the underlying hardware and/or OS 186. In an example embodiment, applications 198A-B run on a virtual machine 170A may be incompatible with the underlying hardware and/or OS 186. For example, applications 198A-B run on one virtual machine 170A may be compatible with the underlying hardware and/or OS 186A while applications 198C-D run on another virtual machine 170B are incompatible with the underlying hardware and/or OS 186. In an example embodiment, a device may be implemented as a virtual machine (e.g., virtual machine 170A-B).

The computer system 100 may include one or more nodes 110A-B. Each node 110A-B may in turn include one or more physical processors (e.g., CPU 120A-C) communicatively coupled to memory devices (e.g., MD 130A-C) and input/output devices (e.g., I/O 140A-B). Each node 110A-B may be a computer, such as a physical machine and may include a device, such as hardware device. In an example, a hardware device may include a network device (e.g., a network adapter or any other component that connects a computer to a computer network), a peripheral component interconnect (PCI) device, storage devices, disk drives, sound or video adaptors, photo/video cameras, printer devices, keyboards, displays, etc. Virtual machines 170A-B may be provisioned on the same host or node (e.g., node 110A) or different nodes. For example, VM 170A and VM 170B may both be provisioned on node 110A. Alternatively, VM 170A may be provided on node 110A while VM 170B is provisioned on node 110B.

In an example, consumer processor 124 and producer processor 128 may be one of the other processor(s) illustrated in FIG. 1, such as a CPU (e.g., CPU 120A-C) on node 110A-B. Similarly, ring buffer 138 may be stored in a memory device, and may be one of the other memory(s) illustrated in FIG. 1, such as MD 130A-C on node 110A-B. Additionally, consumer processor 124 and producer processor 128 may be different cores on the same physical processor. The producer processor 128 may be configured to receive a batch of memory entries and store the memory batch of memory entries in the ring buffer 138 by walking the ring buffer 138 and testing respective slots. For example, the producer processor 128 may walk the ring buffer 138 starting at an original slot, such as a slot indicated by a current producer pointer. As the producer processor 128 walks the ring buffer 138, the producer processor 128 is configured to test respective values associated with memory entries in each slot to identify the last memory entry in the batch that can be stored in the ring buffer 138 (e.g., either part of the batch if a busy or unconsumed slot was encountered or the last memory entry in the batch). For example, the end slot may be associated with the final memory entry ending the batch of memory entries or a slot preceding a valid value slot (e.g., unconsumed slot). Additionally, the testing may be conducted while the contents of each slot remain unchanged.

Then, after identifying the last memory entry that can be stored in the ring buffer 138, the producer processor 128 is configured to produce memory entries to the ring buffer 138 from the initial memory entry in the batch to the last identified memory entry. The producer processor 128 may store or produce memory entries to the ring buffer 138 by walking the ring buffer 138 backwards and storing the memory entries in the previously tested ring buffer 138 slots that were invalid (e.g., empty or consumed). An empty or previously consumed slot may include an invalid value, such as a memory entry in the slot with a "0" value. By producing memory entries in batches, the producer processor 128 prevents cache line bounces after each memory entry production, thereby improving performance and throughput.

As used herein, physical processor or processor 120A-C, 124, and 128 refers to a device capable of executing instructions encoding arithmetic, logical, and/or I/O operations. In one illustrative example, a processor may follow Von Neumann architectural model and may include an arithmetic logic unit (ALU), a control unit, and a plurality of registers. In a further aspect, a processor may be a single core processor which is typically capable of executing one instruction at a time (or process a single pipeline of instructions), or a multi-core processor which may simultaneously execute multiple instructions. In another aspect, a processor may be implemented as a single integrated circuit, two or more integrated circuits, or may be a component of a multi-chip module (e.g., in which individual microprocessor dies are included in a single integrated circuit package and hence share a single socket). A processor may also be referred to as a central processing unit (CPU).

As discussed herein, a memory device 130A-C refers to a volatile or non-volatile memory device, such as RAM, ROM, EEPROM, or any other device capable of storing data. As discussed herein, I/O device 140A-C refers to a device capable of providing an interface between one or more processor pins and an external device capable of inputting and/or outputting binary data.

Processors 120A-C may be interconnected using a variety of techniques, ranging from a point-to-point processor interconnect, to a system area network, such as an Ethernet-based network. Local connections within each node, including the connections between a processor 120A-C and a memory device 130A-C may be provided by one or more local buses of suitable architecture, for example, peripheral component interconnect (PCI).

Figure 2A:
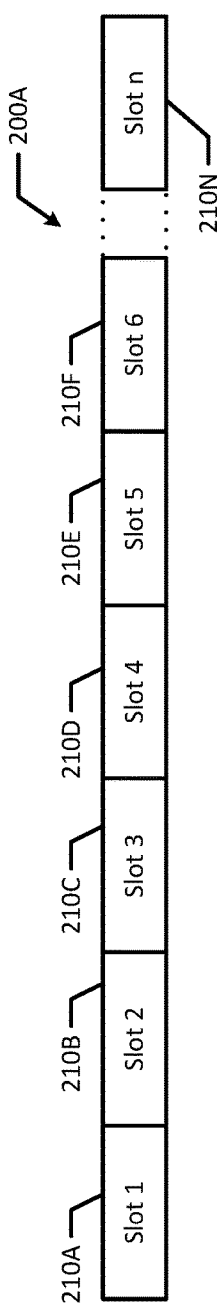
FIG. 2A illustrates a block diagram of an example memory ring according to an example embodiment of the present disclosure.
Figure 2B:
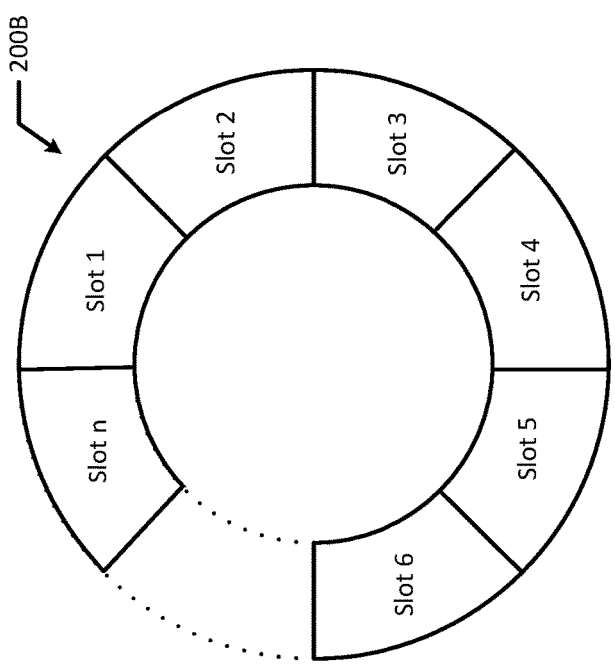
FIG. 2B illustrates a block diagram of an example memory ring according to an example embodiment of the present disclosure.

FIGS. 2A and 2B illustrate block diagrams of example ring buffers 200A and 200B. For example, FIG. 2A illustrates a linear buffer implementation of ring buffer 200A while FIG. 2B illustrates the "ring" structure of ring buffer 200B. It should be appreciated that ring buffers 200A-B may be the same actual memory structure illustrated in two different ways. Ring buffers 200A-B may in be located in cacheable memory, such as L1 cache if on the same physical processor but on different CPU cores. In another example, the ring buffer 200A-B may be on a different level of cache other than L1. Additionally, ring buffers 200A-B may include a plurality of slots (e.g., slots 210A-N). For example, slots 210A-N may correspond to Slot_1 to Slot_n respectively. Each slot may include a memory entry, such as a data packet, a packet address, or the like. Additionally, slots may be empty or may include an invalid value, such as "0". For example, a slot with a memory address of "0" may be used to indicate an empty slot or invalid slot. Valid slots may include a memory entry, such as a data packet or a packet address.

Figure 3:
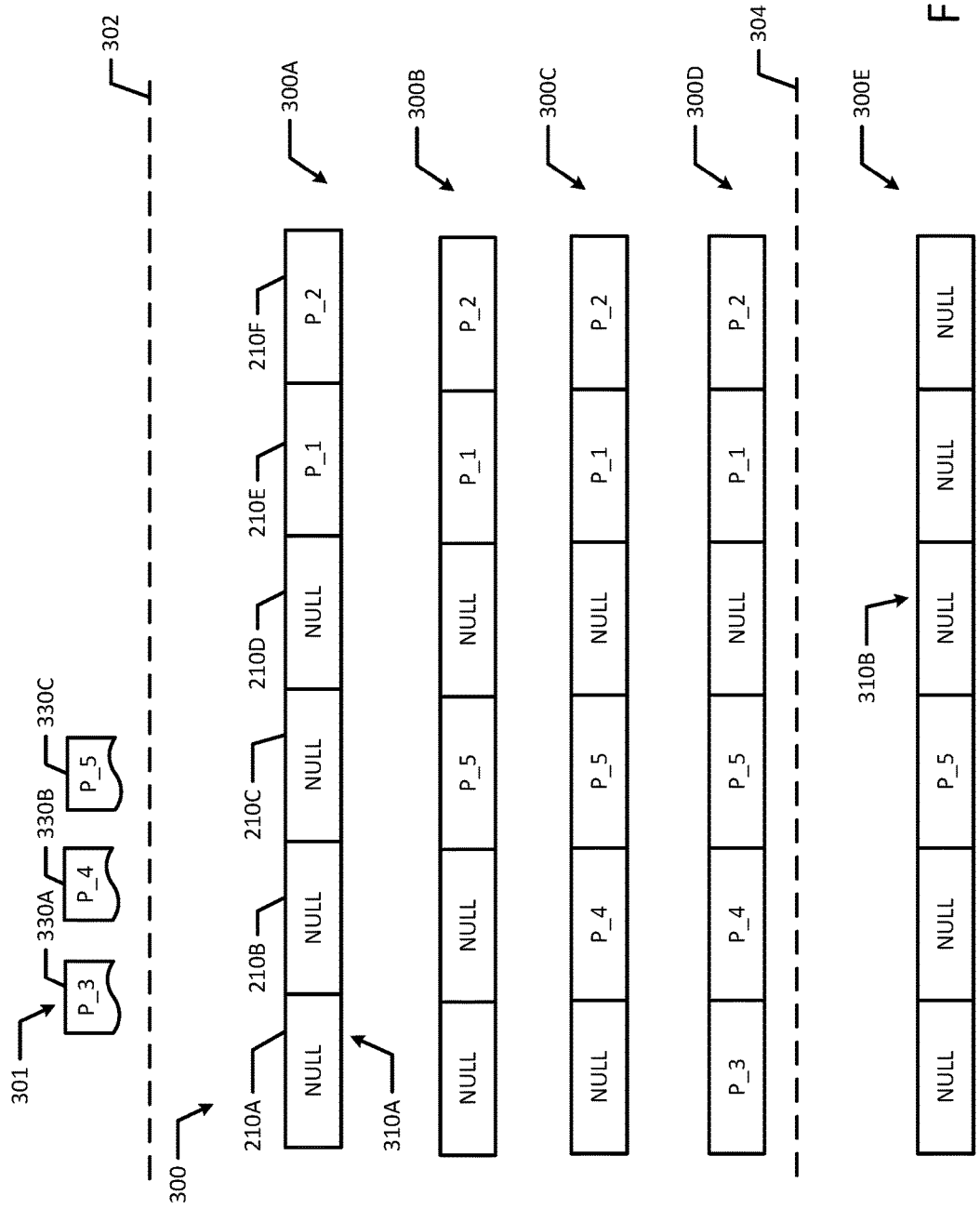
FIG. 3 illustrates a block diagram of reverse order submission of an example memory ring.

FIG. 3 illustrates a block diagram of reverse order submission of an example memory ring, such as ring buffer 138 or 200A-B. For example, memory ring 300 is illustrated as 300A-E, which represents different states of memory ring 300 at different points in time. Memory ring or ring buffer 300 may include six slots (e.g., slots 210A-F). In an example, each slot may include a memory entry, such as a packet address P_1 to P_5 or an invalid value, such as a NULL value. As illustrated in ring buffer 300A, slot 210A includes a NULL value, slot 210B includes a NULL value, slot 210C includes a NULL value, slot 210D includes a NULL value, slot 210E includes packet address P_1, and slot 210F includes packet address P_2. Packet addresses may be written into the memory ring or ring buffer 300 by a producer processor, such as producer processor 128. Additionally, indices or pointers may indicate specific slots in ring buffer 300.

For example, a producer pointer may designate or indicate an original slot (e.g., slot 210A). The producer pointer may be advanced to successive slots as the producer processor tests and/or produces packets to slots. In an example, the producer pointer may be an index, such as a registry.

Additionally, the producer pointer may be maintained in a cache line. A batch 301 of memory entries, such as packets (e.g., packets 330A-C) may be received by producer processor 128. After the batch 301 of packets 330A-C is received, the producer processor 128 may start producing the batch 301 of packets at a later time 302. For example, as illustrated by ring buffer 300A, the producer processor 128 may walk the ring buffer 300A starting from an original slot 310A (e.g., slot 210A), which may be indicated by a producer pointer, to identify the last free slot and the last packet from the batch 201 of packets (e.g., packets 330A-C) that can be stored in the ring buffer 300A by testing each slot and respective memory entry. In the illustrated example, the batch 301 of memory entries includes three memory entries or packets 330A-C and there are three successive free slots (e.g., empty slots) extending from the original slot 310A (e.g., slot 210A) to slot 210C.

After determining that each packet (e.g., packets 330A-C) can be stored in the ring buffer 300, the producer processor 128 may walk the ring backwards and produce the batch 301 of memory entries (e.g., packets 330A-C) to the ring buffer 300. For example, as illustrated by ring buffers 300B-D, the producer processor 128 successively stores packet addresses P_5 to P_3 in slots 210C to 210A respectively.

After memory entries are produced to the ring buffer 300D, the memory entries (e.g., packet addresses P_1 to P_5) may be consumed by consumer processor 124. For example, after some time 304, the consumer processor 124 may retrieve memory entries from slots 210E, 210F, 210A, and 210B. After retrieving the memory entries, the consumer processor 124 may invalidate the group of slots (e.g., slots 210E-F), as illustrated by ring buffer 300E.

The producer processor 128 may proceed producing additional memory entries, such as packet addresses or data packets, from additional batches 301 of received packets. Once the producer processor 128 has produced additional memory entries in the empty or invalidated slots, the consumer processor 124 may once again retrieve and copy those additional memory entries to a second memory, such as a VM memory 195A. For example, the consumer processor 124 may retrieve and copy P_3 and P_4 from slots 210A and 210B respectively after the producer processor 128 is done accessing the cache line for slots 210A and 210B, which advantageously reduces the frequency of cache line bounces between the consumer processor 124 and producer processor 128. For example, the producer processor 128 produces multiple memory entries in batches 301, thereby holding back the consumer processor 124 and advantageously preventing the frequency of cache line bounces without increasing ring size of ring buffer 138. In an example, memory entries in the second memory, such as VM memory 195A may later be stored in a different ring buffer 138.

As illustrated in FIG. 3, the batch of memory entries includes three memory entries (e.g., packets 330A-C), however, batches 301 of different sizes and quantities may be used. For example, the batch 301 may include two, three, four, ten, etc. memory entries. In an example, the batch 301 size and/or quantity may be associated with the size of the ring buffer 138. For example, the batch 301 size and/or quantity may be a fraction of the size of the ring buffer 138 (e.g., 1/16 of a ring, 1/8 of a ring, or 1/4 of a ring). In an example, if the batch 301 size and/or quantity is 1/16 of a ring with 128 slots, then the batch 301 size and/or quantity may be 8 memory entries correlating to 8 slots. Similarly, the batch 301 size and/or quantity may also be related to the quantity of cache lines used by the ring buffer 138. For example, if the ring buffer 138 uses four cache lines (e.g., 32 slot ring where each slot is 8 bytes and four cache lines of 64 bytes), then the batch 301 size and/or quantity may be the quantity of memory entries that are stored in slots dedicated to a single cache line (e.g., 8 slots), which may advantageously prevent cache line bounces between the producer processor 128 and the consumer processor 124 because each processor may be accessing different cache lines. For example, after the producer processor 128 produces memory entries in slots in a first cache line, it may start producing additional memory entries in a different cache line (e.g., second cache line) as the consumer processor 124 is consuming memory entries or slots in the first cache line, thereby allowing the producer processor 128 and the consumer processor 124 to simultaneously execute memory operations in separate cache lines.

Figure 4:
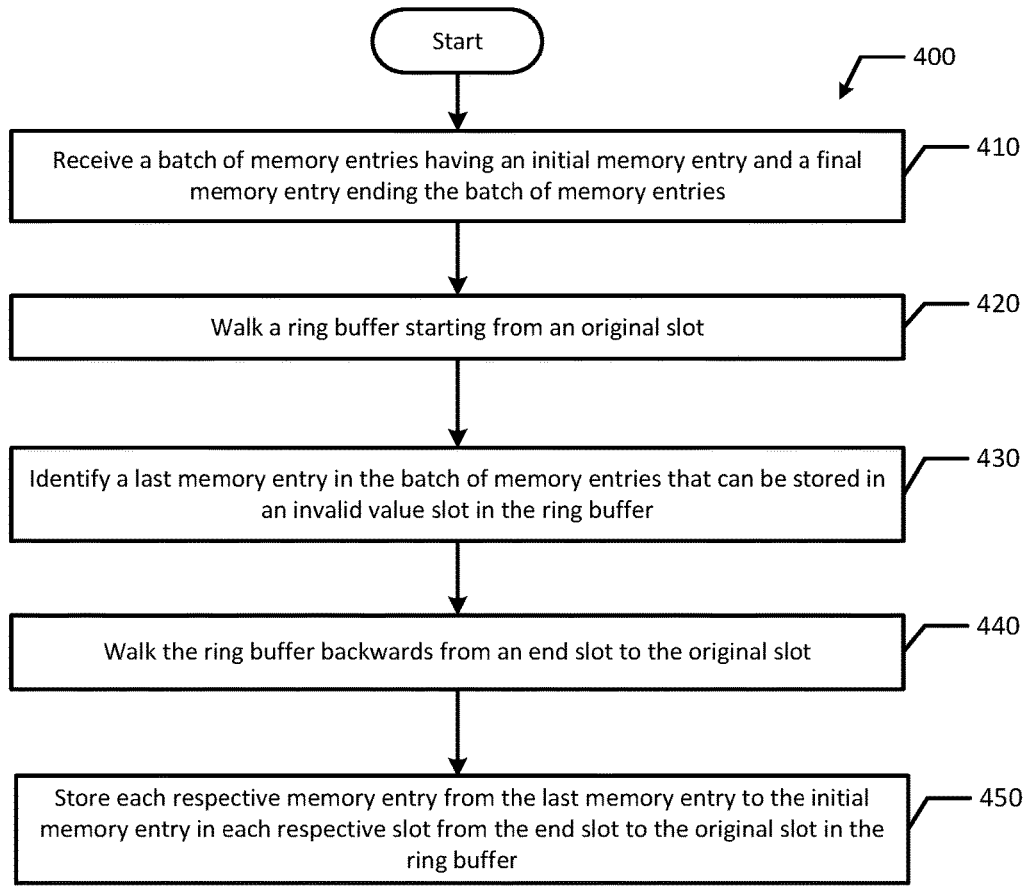
FIG. 4 illustrates a flowchart of an example process for reverse order submission according to an example embodiment of the present disclosure.

FIG. 4 illustrates a flowchart of an example method 400 for reverse order submission according to an example embodiment of the present disclosure. Although the example method 400 is described with reference to the flowchart illustrated in FIG. 4, it will be appreciated that many other methods of performing the acts associated with the method 400 may be used. For example, the order of some of the blocks may be changed, certain blocks may be combined with other blocks, and some of the blocks described are optional. The method 400 may be performed by processing logic that may comprise hardware (circuitry, dedicated logic, etc.), software, or a combination of both.

The example method 400 includes receiving a batch of memory entries having a first memory and a final memory entry ending the batch of memory entries (block 410). For example, a producer processor 128 may receive a batch 301 of memory entries (e.g., three memory entries) having an initial memory entry (e.g., packet 330A) and a final memory entry (e.g., packet 330C), which ends the batch of memory entries (e.g., the last memory entry in the batch 301). In an example, the batch 301 of memory entries may include two or more memory entries, which may be data packets. Then, the producer processor may walk a ring buffer starting from an original slot (block 420). For example, the producer processor 128 may walk the ring buffer 138 forward starting from an original slot 310A toward a slot associated with the final memory entry until identifying an end slot. In an example, the producer processor 128 may execute a walk function to walk the ring buffer 138.

In an example, the producer processor may test a respective value associated with a respective memory entry of each slot in the ring buffer from the original slot toward a slot associated with the final memory entry until identifying an end slot. For example, the producer processor 128 may test respective values (e.g., NULL) associated with respective memory entries of each slot in the ring buffer from the original slot toward a slot associated with the final memory entry until identifying the end slot. The end slot may be a slot associated with the final memory entry (e.g., packet 330C) ending the batch 301 of memory entries, for example, two slots after the original slot 310A if the batch 301 includes three memory entries. Alternatively, the end slot may be a slot preceding a valid value slot or an unconsumed slot with a valid value (e.g., a slot storing a memory entry from a previous batch 301 of memory entries) located between the original slot and the slot associated with the second (e.g., last) memory entry in the batch 301. If there are less unconsumed slots than memory entries in the batch 301 of memory entries, the producer processor 128 may walk to and test a slot after the slot identified as the end slot. For example, with a batch of five memory entries with an original slot 310A (e.g., slot 210A), the slot associated with the fifth memory entry (e.g., slot 210E) is a valid value slot or an unconsumed slot because it includes a value (e.g., P_1). Thus, as illustrated in ring buffer 300A with a batch of five or more memory entries, the end slot would be 210D, which is the last invalid value slot (e.g., empty slot) behind or immediately preceding the unconsumed slot 210E. In an example, the producer processor 128 may perform testing while the contents of each tested slot remain unchanged. For example, the producer processor 128 may test slots without storing or producing memory entries to the slots, which advantageously prevents the consumer processor 124 from prematurely consuming memory entries from the ring buffer 138. A valid value slot is a slot with a valid value. A valid value slot may be an unconsumed slot that is non-empty and has a non-NULL value. On the other hand, an invalid value slot is a slot with an invalid value. An invalid value slot may be a consumed slot that is empty and has a NULL value.

The producer processor may identify a last memory entry in the batch of memory entries that can be stored in an invalid value slot in the ring buffer (block 430). For example, the producer processor 128 may identify a last memory entry in the batch of memory entries that can be stored in an empty slot (e.g., a previously consumed slot including an invalid or NULL value) in the ring buffer 138. In an example, the producer processor 128 may identify the last memory entry by testing slots as described above. In a batch 301 of three memory entries, the last memory entry will be either the third memory entry or a preceding memory entry if there is a sufficient quantity of empty slots (e.g., NULL valued slots) for each of the memory entries. If there are not enough successive empty slots to accommodate each memory entry in the batch 301, then the last memory entry will be either the starting memory entry of the batch 301 or an intermediate memory entry of the batch 301 depending on the quantity of available empty slots. Then, the producer processor may walk the ring buffer backwards from an end slot to the original slot (block 440). For example, after identifying the end slot (e.g., slot 210C) and the last memory entry (e.g., packet P_5), the producer processor 128 may walk the ring buffer 138 backwards from the end slot (e.g., slot 210C) associated with the last memory entry (e.g., packet P_5) to the original slot 310A. The end slot may be an invalid value slot (e.g., NULL value) associated with the final memory entry ending the batch of memory entries or a slot preceding a valid value slot. Additionally, the producer processor may store each respective memory entry from the last memory entry to the initial memory entry in each respective slot from the end slot to the original slot in the ring buffer (block 450). For example, the producer processor 128 may store each respective memory entry (e.g., packets 330A-C with packet address values P_3 to P_5) from the last memory entry (e.g., packet P_5) to the initial memory entry (e.g., packet P_3) in each respective slot (e.g., slots 210A-C) from the end slot to the original slot 310A in the ring buffer 138. In an example, the producer processor 128 may store memory entries in the respective slots, such that the memory entries are stored in the ring buffer 138 in the same order they appear in the batch 301 of memory entries. For example, if the batch 301 of memory entries includes three data packets (e.g., packets P_1 to P_3), but there are only two available empty slots, the producer processor 128 may store packets P_2 and P_1 while walking backwards to maintain the order of the data packets from batch 301. Additionally, memory entries may be stored in the ring buffer 138 in reverse order, random order, etc. depending on the application.

If the batch 301 of memory entries includes three entries, then the producer processor 128 may produce or store up to three memory entries in the ring buffer 138. If some of the slots include a valid value (e.g., non-NULL value), the producer processor 128 may store less than three memory entries from batch 301 in the ring buffer 138 (at least until additional slots are consumed by the consumer processor 124). For example, the producer processor 128 may advantageously produce or store less than the entire batch 301 of memory entries to increase efficiency and reduce downtime associated with waiting for additional slots to be invalidated by the consumer processor 124, which may cause undue delays when there is a slowdown in copying and removing memory entries from the ring buffer 138. In an example, the producer processor 128 may be paused or may wait before attempting to produce additional memory entries (e.g., the producer processor 128 may go to sleep before being woken up later to produce additional packets). For example, after testing a slot and receiving or reading a valid value (e.g., non-NULL value), a timer may start and count up to a predetermined timespan (e.g., 25 milliseconds, one second, 20 seconds) before the producer processor 128 attempts to produce additional memory entries. In another example, the producer processor 128 may pause after testing a slot with a valid or non-NULL value (e.g., an unconsumed or busy slot) until it receives an additional batch 301 of memory entries.

After the producer processor 128 stores the respective memory entries, the consumer processor 124 may retrieve, copy, and/or invalidate memory entries in the ring buffer. For example, the consumer processor 124 may invalidate each consumed slot by overwriting the slot with a NULL value, such as a "0" address value.

By producing each memory entry in a batch 301 all together instead of one at a time (e.g., one-by-one), the consumer processor 124 is advantageously held back from accessing the ring buffer 138 (e.g., cache line associated with slot in the ring buffer 138), which reduces the frequency and/or occurrence of a cache line bounce. For example, depending on the batch 301 size used and the ring size of ring buffer 138, the producer processor 128 and consumer processor 124 may be accessing slots that are far enough away from each other (e.g., in different cache lines) that neither is accessing the same cache line at the same time. For example, a cache line may be 64 bytes, and a slot may be 8 bytes, thus a ring buffer 138 may take up multiple cache lines. If the producer processor 128 and the consumer processor 124 are producing and consuming memory entries in slots that are positioned more than 8 slots away from each other in the above example, the producer processor 128 and the consumer processor 124 may be utilizing different cache lines. Accordingly, in this example, the batch 301 size or quantity may be 8 or more memory entries (e.g., with one memory entry per slot) so the respective cache lines used by the producer processor 128 and the consumer processor 124 may not overlap thereby avoiding or minimizing cache line bounces.

After a memory entry is produced to the original slot, a cache line may bounce between the producer processor 128 and the consumer processor 124. For example, while the producer processor 128 is accessing the ring buffer 138, the producer processor 128 may access the cache line for the ring buffer 138. However, when the consumer processor 124 needs to access the memory for the ring buffer 138, the consumer processor 124 may request access to the cache line to determine the current state of the ring buffer 138 (e.g., what memory entries are present in the ring buffer 138), thereby causing a cache line bounce which may slow down the process of storing and/or forwarding network traffic (e.g., data packets). In an example, a cache line may be 64 bytes wide. When either the consumer processor 124 or producer processor 128 needs to read or write a location in the ring buffer 138, the consumer processor 124 and/or producer processor 128 may check for a corresponding entry in the cache. For example, the cache may check for the contents of the requested memory location (e.g., ring slot) in any cache lines that may contain the address.

Figure 5A:
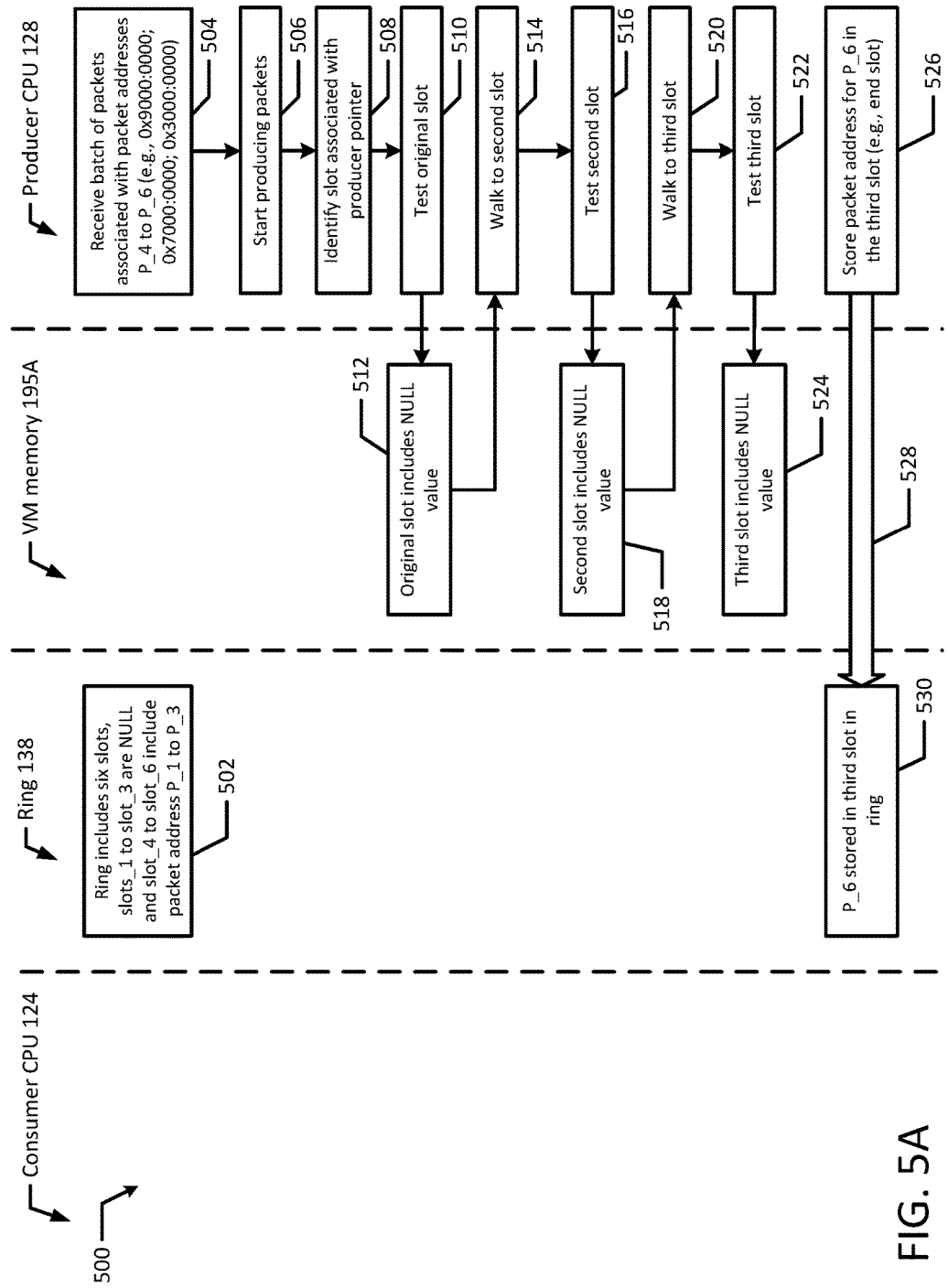
FIGS. 5A, 5B, and 5C illustrate a flow diagram of an example process for reverse order submission for pointer rings according to an example embodiment of the present disclosure.
Figure 5B:
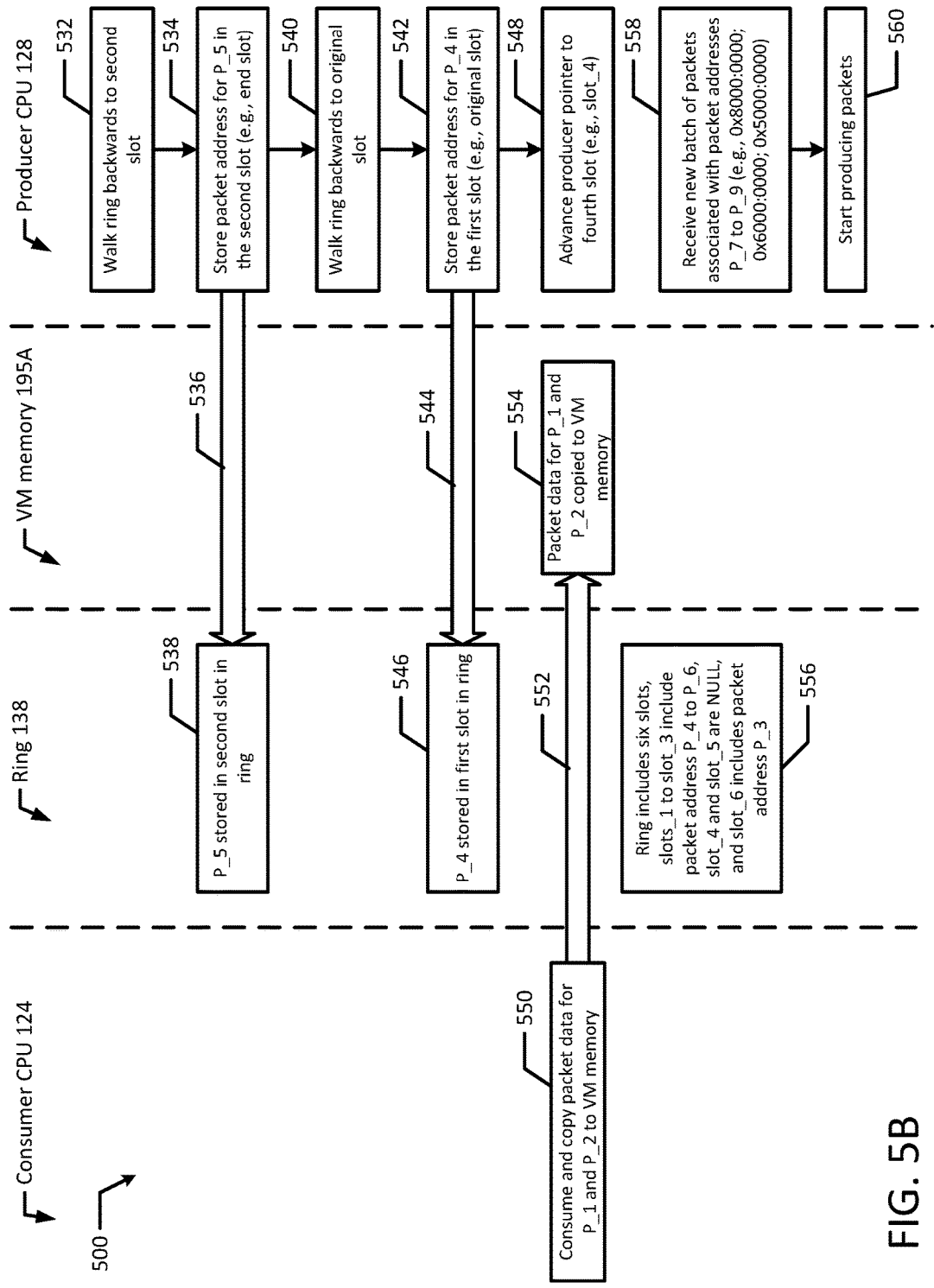
Figure 5C:
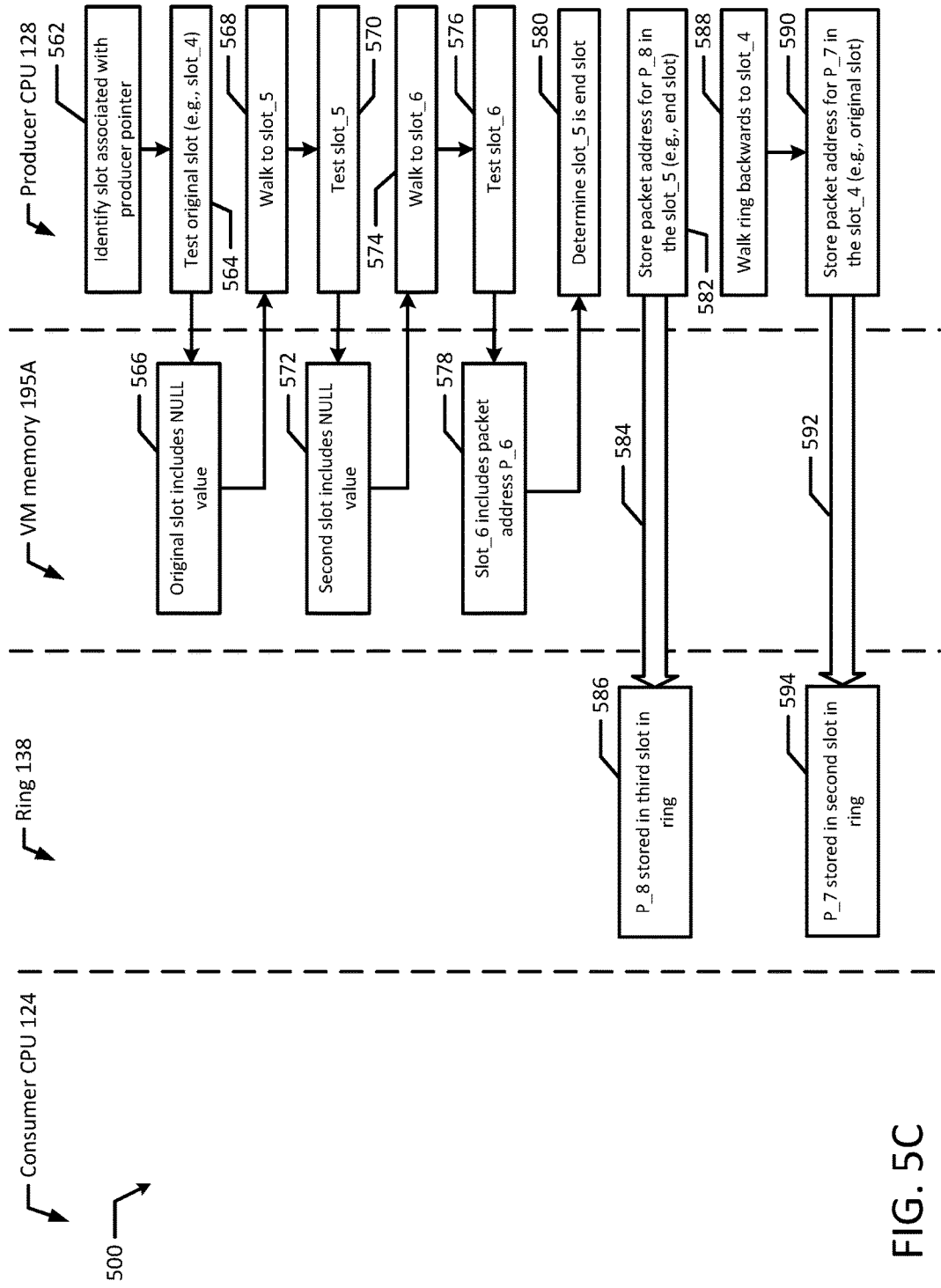

FIGS. 5A, 5B, and 5C illustrate a flowchart of an example method 500 for reverse order submission for pointer rings in accordance with an example embodiment of the present disclosure. Although the example method 500 is described with reference to the flowchart illustrated in FIGS. 5A, 5B, and 5C it will be appreciated that many other methods of performing the acts associated with the method 500 may be used. For example, the order of some of the blocks may be changed, certain blocks may be combined with other blocks, and some of the blocks described are optional. For example, a consumer processor 124 (e.g., consumer CPU) and a producer processor 128 (e.g., producer CPU) may communicate with a ring buffer 138 and virtual machine memory 195A to perform example method 500.

In the illustrated example, the ring 138 includes six slots, where slot_1 to slot_3 are invalid (e.g., NULL) and packet addresses P_1 to P_3 are stored in slot_4 to slot_6 (block 502). In an example, a memory address of "0" may represent a NULL value. Additionally, in slot_1 to slot_3 may be recently consumed slots (e.g., had packet addresses that were copied and invalidated by the consumer CPU 124). The producer CPU 128 may receive a batch 301 of packets associated with packet addresses P_4 to P_6 (block 504). For example, the producer CPU 128 may receive a batch 301 of packets with packet addresses 0x9000:0000, 0x7000:0000, and 0x3000:0000 corresponding to packet addresses P_4 to P_6. Then, the producer CPU 128 may start producing packets (block 506). In an example, the producer CPU 128 may start producing packets (e.g., packet addresses) after receiving the batch 301 of packets.

To start producing packets, the producer CPU 128 may identify the slot associated with a producer pointer (block 508). For example, the producer CPU 128 may identify the slot indicated by the producer pointer (e.g., an original slot), which is preferably the next available slot after the last full slot (e.g., slot that includes a non-NULL memory entry). For example, if the ring buffer 138 is typically filled from slot_1 to slot_6, then in the illustrated example, the producer pointer would indicate slot_1 (e.g., the next available slot after slot_6) such that packets can sequentially be stored in slot_1 to slot_3. Then, the producer CPU may test the original slot (e.g., slot_1) (block 510). For example, the producer CPU 128 may test slot_1 to determine the value of the memory entry or packet address in the slot. In the illustrated example, the first slot includes a NULL value or "0" value (block 512). For example, the producer CPU 128 may read slot_1 while testing the first slot or original slot to determine that the first slot includes a packet address of "0".

After determining that the original slot includes a NULL value, the producer CPU 128 may walk to the second slot (e.g., slot_2) (block 514). For example, the producer CPU 128 may advance to the second slot using a walk function. Then, the producer CPU 128 may test the second slot (e.g., slot_2) (block 516). For example, the producer CPU 128 may test slot_2 to determine the value of the memory entry or packet address in the slot. In the illustrated example, the second slot includes a NULL value or "0" value (block 518).

For example, the producer CPU 128 may read slot_2 while testing the second slot to determine that the second slot includes a packet address of "0". After determining that the second slot includes a NULL value, the producer CPU 128 may walk to the third slot (e.g., slot_3) (block 520). Similar to above, the producer CPU 128 may advance to the third slot using a walk function. Then, the producer CPU 128 may test the third slot (e.g., slot_3) (block 522). For example, the producer CPU 128 may test slot_3 to determine the value of the memory entry or packet address in the slot. In the illustrated example, the third slot includes a NULL value or "0" value (block 524). For example, the producer CPU 128 may read slot_3 while testing the third slot to determine that the third slot includes a packet address of "0".

Since there is an adequate quantity of invalid value slots or empty slots for each packet (e.g., packets associated with packet addresses P_4 to P_6) in the batch 301 of packets, the producer CPU 128 may store the entire batch 301 in the ring buffer 138. In the illustrated example, the producer CPU stores packet address for P_6 in the third slot (e.g., end slot) (blocks 526 and 528). For example, the producer CPU 124 may store packet addresses P_4 to P_6 in the ring buffer 138 in reverse order while walking the ring 138 backwards from slot_3 (e.g., end slot) to slot_1 (e.g. original slot). Then, P_6 is stored in the third slot in the ring buffer 138 (block 530). For example, the producer CPU 128 may store packet address P_6 in the ring 138 by writing the packet address into the slot (e.g., replacing NULL value with packet address). In the illustrated example, the ring 138 now includes NULL values in the slot_1 and slot_2 and has packet addresses P_6 and P_1 to P_3 in slot_3 to slot_6.

Then, the producer CPU 128 walks the ring backwards to the second slot (e.g., slot_2) (block 532). In an example, the producer CPU 128 may walk the ring buffer 138 backwards via a walk command or walk function. Then, the producer CPU 128 stores packet address for P_5 in the second slot (e.g., slot_2) (blocks 534 and 536). For example, the producer CPU 128 may store packet addresses P_5 in the ring 138 by writing the packet address into the slot (e.g., replacing NULL value with packet address). Then, P_5 is stored in the third slot in the ring buffer 138 (block 538). In the illustrated example, the ring 138 now includes six slots with a NULL values in the slot_1 and has packet addresses P_5, P_6 and P_1 to P_3 in slot_2 to slot_6. Similarly, the producer CPU 128 may walk the ring buffer 138 backwards to the first slot or original slot (e.g., slot_1) (block 540). In an example, the producer CPU 128 may walk the ring buffer 138 backwards via a walk command or walk function. Then, the producer CPU 128 stores packet address for P_4 in the first slot or original slot (e.g., slot_1) (blocks 542 and 544). For example, the producer CPU 128 may store packet addresses P_4 in the ring 138 by writing the packet address into the slot (e.g., replacing NULL value with packet address). Then, P_4 is stored in the first slot in the ring buffer 138 (block 546). In the illustrated example, the ring 138 now includes six slots with packet addresses P_4 to P_6 and P_1 to P_3 in slot_1 to slot_6. Producing the memory entries, such as data packets in batches or groups advantageously improves performance and throughput without increasing ring size of ring buffer 138, especially when a driver is not highly optimized and receiving is slower than copying packets.

Then, the producer CPU 128 may advance the producer pointer to the fourth slot (e.g., slot_4) (block 548). For example, the producer CPU 128 may advance the producer pointer to the slot after the last filled slot (e.g., slot_4 since the producer CPU 128 last filled slot_3), which will indicate to the producer CPU 128 where to start adding new packets in the future. In an example, the producer CPU 128 may wait to advance the producer pointer to slot_4 until after the slot is consumed (e.g., P_1 is copied and invalidated by the consumer CPU 12). By maintaining the producer pointer location, the producer CPU 128 may advantageously store packets or packet addresses in the ring buffer 138 in sequential order, as they are received in the batches 301, such that data is consumed by the consumer CPU 124 sequentially.

The consumer CPU 124 consumes and copies packet data for P_1 and P_2 to VM memory 195A (blocks 550 and 552). For example, the consumer CPU 124 may retrieve packet addresses P_1 and P_2 from slot_1 and slot_2, and then copy the packets associated with packet addresses P_1 and P_2 to VM memory 195A. Additionally, consuming packets may include invalidating slot_1 and slot_2. In an example, the packet data may be copied to VM memory 195A from a temporary memory location. Then, packet data for P_1 and P_2 is copied to VM memory 195A (block 554). In an example, packet data for P_1 and P_2 may be copied to VM memory 195A in a batch. Additionally, packet data for P_1 and P_2 may be copied to VM memory 195A sequentially as each packet address is retrieved by the consumer CPU 124. The consumer CPU 124 may wait until an entire batch 301 of packets is produced before consuming additional packets to ensure that adequate spacing is maintained between slots accessed by the producer CPU 128 and the consumer CPU 124 to help further reduce the frequency of cache line bounces.

After the consumer CPU 124 consumes packets P_1 and P_2, the six slots of the ring buffer 138 include packet addresses P_4 to P_6 in slot_1 to slot_3, slot_4 and slot_5 are NULL, and slot_6 includes packet addressP_3 (block 556). Consumer CPU 124 may consume additional packets, for example, continuing in order to consume packet P_3 and so forth. Additionally, the producer CPU 128 may receive additional batches 301 of packets and produce those packets to the empty slots in the ring buffer 138. In the illustrated example, the producer CPU 128 receives a new batch 301 of packets associated with packet addresses P_7 to P_9 (block 558). For example, the producer CPU 128 may receive a new batch 301 of packets with packet addresses 0x8000:0000, 0x6000:0000, and 0x5000:0000 corresponding to packet addresses P_7 to P_9. Then, the producer CPU 128 may start producing packets (block 560). In an example, the producer CPU 128 may start producing packets (e.g., packet addresses) immediately after receiving the batch 301 of packets. In another example, the producer CPU 128 may start producing packets after a predetermined amount of time or after receiving a request to produce the batch 301 of packets.

To start producing packets from the new batch 301, the producer CPU 128 may identify the slot associated with a producer pointer (block 562). For example, the producer CPU 128 may identify the slot indicated by the producer pointer (e.g., a new original slot), which is preferably the next available slot after the last full slot (e.g., slot that includes a non-NULL memory entry). For example, in the illustrated example, the producer pointer would indicate slot_4 (e.g., the next available slot after slot_3) since slot_3 was the last slot filled by the producer CPU 128. Then, the producer CPU may test the original slot (e.g., slot_4) (block 564). For example, the producer CPU 128 may test slot_4 to determine the value of the memory entry or packet address in the slot. In the illustrated example, the fourth slot includes a NULL value or "0" value (block 566). For example, the producer CPU 128 may read slot_4 while testing the fourth slot or new original slot to determine that the fourth slot includes a packet address of "0".

After determining that the original slot includes a NULL value, the producer CPU 128 may walk to the fifth slot (e.g., slot_5) (block 568). For example, the producer CPU 128 may advance to the fifth slot using a walk function. Then, the producer CPU 128 may test the fifth slot (e.g., slot_5) (block 570). For example, the producer CPU 128 may test slot_5 to determine the value of the memory entry or packet address in the slot. In the illustrated example, the fifth slot includes a NULL value or "0" value (block 572). For example, the producer CPU 128 may read slot_5 while testing the fifth slot to determine that the second slot includes a packet address of "0". After determining that the fifth slot includes a NULL value, the producer CPU 128 may walk to the sixth slot (e.g., slot_6) (block 574). Similar to above, the producer CPU 128 may advance to the sixth slot using a walk function. Then, the producer CPU 128 may test the sixth slot (e.g., slot_6) (block 576). For example, the producer CPU 128 may test slot_6 to determine the value of the memory entry or packet address in the slot. In the illustrated example, the sixth slot includes a packet address for P_6 (e.g., 0x3000:0000) (block 578). For example, the consumer CPU 124 may read slot_6 while testing the first slot to determine that the sixth slot includes a packet address of 0x3000:0000. The producer CPU 128 walks to the sixth slot because there are three packets in the new batch 301, and with each slot storing a packet address for a packet, the producer CPU 128 walks forward the same quantity of slots as packet addresses in the batch or until encountering a busy slot before that point.

Upon testing a busy (e.g., non-NULL value, 0x3000: 0000) slot, the producer CPU 128 determines that slot_5 is the end slot (block 580). Similarly, the producer CPU 128 may determine that packet P_8 is the last packet from the batch 301 that can be stored in the ring buffer 138. For example, upon receiving a non-NULL value, the producer CPU 128 may stop testing slots. A non-NULL value may indicate that the remainder of the ring is full and that there are currently no additional empty slots that packets can be written into. In an example, the producer processor 128 may be paused or may wait before attempting to produce additional memory entries. For example, after testing a slot and receiving or reading a non-NULL value, a timer may start and count up to a predetermined timespan (e.g., 25 milliseconds, one second, 20 seconds) before the producer processor 128 attempts to produce additional memory entries. For example, the producer processor 128 may wait and then retry to produce the remaining packets in the new batch 301. Additionally, the unproduced packets may be discarded, sent back to the user, or temporarily stored so that the packets can be produced at a later time.

In the illustrated example, the producer CPU stores packet address for P_8 in the fifth slot (e.g., end slot) (blocks 582 and 584). For example, the producer CPU 124 may store packet addresses P_8 to P_7 in the ring buffer 138 in reverse order while walking the ring 138 backwards from slot_5 (e.g., new end slot) to slot_4 (e.g. new original slot). Then, P_8 is stored in the fifth slot in the ring buffer 138 (block 586). For example, the producer CPU 128 may store packet addresses P_8 in the ring 138 by writing the packet address into the slot (e.g., replacing NULL value with packet address). Then, the producer CPU 128 walks the ring backwards to the fourth slot (e.g., slot_4) (block 588). In an example, the producer CPU 128 may walk the ring buffer 138 backwards via a walk command or walk function. Then, the producer CPU 128 stores packet address for P_7 in the fourth slot (e.g., slot_4) (blocks 590 and 592). For example, the producer CPU 128 may store packet addresses P_7 in the ring 138 by writing the packet address into the slot (e.g., replacing NULL value with packet address). Then, P_7 is stored in the fourth slot in the ring buffer 138 (block 594). For example, the six slots of ring 138 now includes six slots with a packet address P_3 in slot_6 and packet addresses P_4 to P_8 in slot_1 to slot_5.

Figure 6:
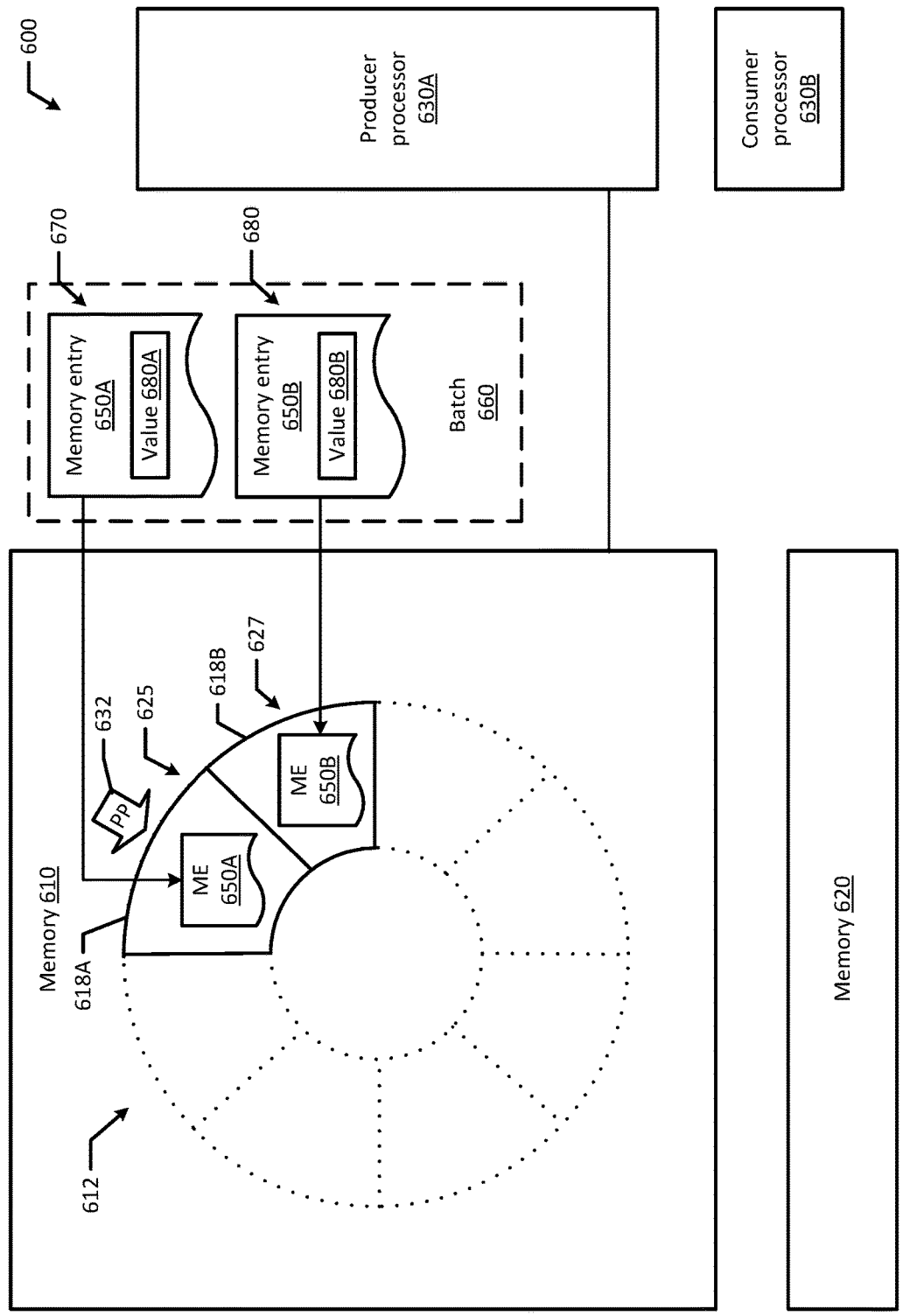
FIG. 6 illustrates a block diagram of an example reverse order submission system according to an example embodiment of the present disclosure.

FIG. 6 is a block diagram of an example reverse order submission system 600 according to an example embodiment of the present disclosure. The reverse order submission system 600 includes a first memory 610 including a ring buffer 612 having a plurality of slots 618A-B. The ring buffer 612 may have any appropriate number of slots, which may vary depending on application. The reverse order submission system 600 may also include a second memory 620 and at least one processor 630A-B in communication with the first memory 610. The at least one processor 630A-B includes a producer processor 630A and a consumer processor 630B. The producer processor 630A may be configured to receive a batch 660 of memory entries (e.g., memory entries 650A-B) having an initial memory entry 670 (e.g., memory entry 650A) and a final memory entry 680 (e.g., memory entry 650B) ending the batch 660 of memory entries. Additionally, the producer processor 630A is configured to walk the ring buffer 612 starting from an original slot 625. The original slot 625 is indicated by a current producer pointer 632. Further, the producer processor 630A is configured to identify a last memory entry (e.g., memory entry 650B) in the batch 660 of memory entries 650A-B that can be stored in an empty slot in the ring buffer 612, walk the ring buffer 612 backwards from an end slot 627 associated with the last memory entry (e.g., memory entry 650B) to the original slot 625, and store each respective memory entry (e.g., memory entries 650A-B) from the last memory entry to the initial memory entry 670 (e.g., memory entry 650A) in each respective slot from the end slot 627 to the original slot 625 in the ring buffer 612. The end slot 627 is one of a slot associated with the final memory entry 680 (e.g., memory entry 650B) ending the batch 660 of memory entries and a slot preceding a valid value slot (e.g., a slot with a non-NULL value), and the testing is conducted while the contents of each slot (e.g., slots 618A-B) remain unchanged.

Instead of a cache line constantly bouncing between the producer processor 630A and consumer processor 630B, the producer processor 630A advantageously produces multiple memory entries 650 from a batch 660 of memory entries (e.g., 2, 3, 8, 16 memory entries) at a time, thereby allowing multiple memory entry operations before the cache line bounces to the consumer processor 630B, which improves performance and throughput without increasing the size of the ring buffer 612.

It will be appreciated that all of the disclosed methods and procedures described herein can be implemented using one or more computer programs or components. These components may be provided as a series of computer instructions on any conventional computer readable medium or machine readable medium, including volatile or non-volatile memory, such as RAM, ROM, flash memory, magnetic or optical disks, optical memory, or other storage media. The instructions may be provided as software or firmware, and/or may be implemented in whole or in part in hardware components such as ASICs, FPGAs, DSPs or any other similar devices. The instructions may be configured to be executed by one or more processors, which when executing the series of computer instructions, performs or facilitates the performance of all or part of the disclosed methods and procedures.

It should be understood that various changes and modifications to the example embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A system comprising:
a first memory including a ring buffer having a plurality of slots;
a second memory; and
at least one processor in communication with the first memory, wherein the at least one processor includes a consumer processor and a producer processor, and the producer processor is configured to:
receive a batch of memory entries having an initial memory entry and a final memory entry ending the batch of memory entries,
walk the ring buffer starting from an original slot, wherein the original slot is indicated by a current producer pointer,
identify a last memory entry in the batch of memory entries that can be stored in an invalid value slot in the ring buffer,
walk the ring buffer backwards from an end slot associated with the last memory entry to the original slot, wherein the end slot is one of a first slot associated with the final memory entry ending the batch of memory entries and a second slot preceding a valid value slot, and
store each respective memory entry from the last memory entry to the initial memory entry in each respective slot from the end slot to the original slot in the ring buffer.

2. The system of claim 1, wherein a valid value slot includes a non-NULL value, and wherein upon receiving a non-NULL value from the test, the producer processor is configured to return an un-stored memory entry from the batch of memory entries back to a user.

3. The system of claim 1, wherein the consumer processor is configured to retrieve each respective memory entry from the last memory entry to the initial memory entry and copy each respective memory entry from the last memory entry to the initial memory entry to the second memory.

4. The system of claim 1, wherein the last memory entry and the final memory entry are the same.

5. The system of claim 1, wherein the invalid value slot includes a NULL value.

6. The system of claim 1, wherein the current producer pointer is an index.

7. The system of claim 1, further comprising a batch counter, wherein the batch counter is configured to count memory entries and send the batch of memory entries to the producer processor.

8. The system of claim 1, wherein the consumer processor and the producer processor are on different cores of the same physical processor.

9. The system of claim 1, wherein the consumer processor and the producer processor are different physical processors.

10. The system of claim 1, wherein the batch of memory entries are packet addresses and the second memory is a virtual machine memory.

11. A method comprising:
receiving, by a producer processor, a batch of memory entries having an initial memory entry and a final memory entry ending the batch of memory entries;
walking, by the producer processor, a ring buffer starting from an original slot, wherein the original slot is indicated by a current producer pointer;
identifying, by the producer processor, a last memory entry in the batch of memory entries that can be stored in an invalid value slot the ring buffer;
walking, by the producer processor, the ring buffer backwards from an end slot associated with the last memory entry to the original slot, wherein the end slot is one of a first slot associated with the final memory entry ending the batch of memory entries and a second slot preceding a valid value slot; and
storing, by the producer processor, each respective memory entry from the last memory entry to the initial memory entry in each respective slot from the end slot to the original slot in the ring buffer.

12. The method of claim 11, further comprising responsive to testing a valid value slot, pausing, by the producer CPU, a predetermined timespan before testing the slot again.

13. The method of claim 11, wherein a valid value slot includes a non-NULL value, and wherein upon receiving a non-NULL value from the test, the producer processor returns the remaining memory entries from the batch back to a user.

14. The method of claim 11, further comprising:
retrieving, by the consumer processor, the initial memory entry; and
copying, by the consumer processor, the initial memory entry to the second memory.

15. The method of claim 11, wherein the consumer processor starts processing the batch of memory entries after the whole batch of memory entries has been stored by the producer processor.

16. The method of claim 11, wherein identifying the last memory entry includes testing a respective value associated with a respective memory entry of each slot in the ring buffer from the original slot to the first slot, wherein the testing is conducted while the contents of each slot remain unchanged.

17. The method of claim 11, wherein the current producer pointer is maintained in a cache line.

18. The method of claim 11, further comprising advancing, by the producer processor, the current producer pointer to the end slot.

19. The method of claim 11, wherein the batch of memory entries are received in response to a batch counter counting to a threshold quantity of memory entries.

20. A non-transitory machine readable medium storing code, which when executed by a producer processor, is configured to:
receive a batch of memory entries having an initial memory entry and a final memory entry ending the batch of memory entries;
walk a ring buffer starting from an original slot, wherein the original slot is indicated by a current producer pointer;
identify a last memory entry in the batch of memory entries that can be stored in an invalid value slot in the ring buffer;
walk the ring buffer backwards from an end slot associated with the last memory entry to the original slot, wherein the end slot is one of a first slot associated with the final memory entry ending the batch of memory entries and a second slot preceding a valid value slot; and store each respective memory entry from the last memory entry to the initial memory entry in each respective slot from the end slot to the original slot in the ring buffer.

* * * * *